(12) United States Patent
Smith et al.

(10) Patent No.: US 6,862,181 B1
(45) Date of Patent: Mar. 1, 2005

(54) APPARATUS AND METHOD FOR SHIELDING A CIRCUIT BOARD

(75) Inventors: Grant M. Smith, Bryn Athyn, PA (US); Daniel A. Jochym, Downingtown, PA (US); Mark W. Wessel, Bala Cynwyd, PA (US)

(73) Assignee: Unisys Corporation, Blue Bell, PA (US)

( * ) Notice: Subject to any disclaimer, the term of this patent is extended or adjusted under 35 U.S.C. 154(b) by 39 days.

(21) Appl. No.: 10/390,461

(22) Filed: Mar. 17, 2003

(51) Int. Cl.$^7$ ................................. H05K 7/20

(52) U.S. Cl. .............. 361/690; 361/688; 361/796; 361/818; 361/719; 174/16.3; 174/35 R

(58) Field of Search ................ 361/688–690, 361/694, 695, 704, 715–721, 800, 816, 818; 174/16.1, 16.3, 35 R; 165/80.3, 185

(56) References Cited

U.S. PATENT DOCUMENTS

| | | | | |
|---|---|---|---|---|
| 4,616,101 A | * | 10/1986 | Veerman et al. | 174/35 MS |
| 5,672,844 A | * | 9/1997 | Persson et al. | 174/35 R |
| 5,936,836 A | * | 8/1999 | Scholder | 361/695 |
| 5,963,424 A | * | 10/1999 | Hileman et al. | 361/695 |
| 6,049,469 A | * | 4/2000 | Hood et al. | 361/818 |
| 6,128,194 A | * | 10/2000 | Francis | 361/737 |
| 6,157,548 A | * | 12/2000 | Collins et al. | 361/818 |
| 6,515,863 B2 | * | 2/2003 | Lin | 361/719 |
| 6,593,525 B1 | * | 7/2003 | Vanderhoof et al. | 174/50 |
| 6,683,787 B1 | * | 1/2004 | Banton et al. | 361/690 |
| 6,707,675 B1 | * | 3/2004 | Barsun et al. | 361/704 |
| 6,741,675 B2 | * | 5/2004 | Chea et al. | 379/22.04 |
| 2003/0184976 A1 | * | 10/2003 | Brandenburg et al. | 361/719 |

* cited by examiner

*Primary Examiner*—Boris Chervinsky
(74) *Attorney, Agent, or Firm*—Lise A. Rode; Mark T. Starr; RatnerPrestia

(57) ABSTRACT

An apparatus directs airflow adjacent a circuit board to provide cooling and provides shielding for the circuit board to reduce EMI. The apparatus comprises a barrier for directing airflow and a conductive layer, electrically grounded and physical associated with the barrier, for providing shielding for the circuit board to reduce EMI.

25 Claims, 5 Drawing Sheets

APPARATUS AND METHOD FOR SHIELDING A CIRCUIT BOARD

FIELD OF THE INVENTION

The present invention generally relates to electronics packaging, and more particularly relates to an apparatus for enhancing air cooling and providing Electromagnetic Interference (EMI) shielding for a circuit board.

BACKGROUND OF THE INVENTION

As the market demands continually smaller computer servers with higher performance, space in these products is at a premium, and packaging density is increased. The higher performance demanded in today's servers requires signal busses and various other signals that operate at very high speeds. This increased speed, along with an increase in packaging density, makes it difficult to meet requirements for Electromagnetic Interference (EMI). Higher performance demands and increased packaging density also make it increasingly difficult to maintain operating temperatures that do not adversely effect various components used in today's servers.

Accordingly, there remains a need for systems with improved EMI shielding while maintaining acceptable operating temperatures. There also remains a need to reduce the space required to perform the functions of directing airflow and EMI shielding.

SUMMARY OF THE INVENTION

The present invention provides an apparatus that both directs airflow proximate a circuit board for cooling the circuit board and provides shielding for the circuit board to reduce EMI. In an exemplary embodiment of the present invention, the apparatus comprises a barrier configured to extend proximal the circuit board and at least one conductive layer physically associated with the barrier. The barrier is configured to extend proximal the circuit board and to direct airflow adjacent the circuit board for cooling. The conductive layer or layers is physically associated with the barrier and electrically grounded to provide shielding for the drcuit board to reduce EMI.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features may be arbitrarily expanded or reduced for clarity. Included in the drawing are the following figures.

DETAILED DESCRIPTION OF THE INVENTION

Figure 1:
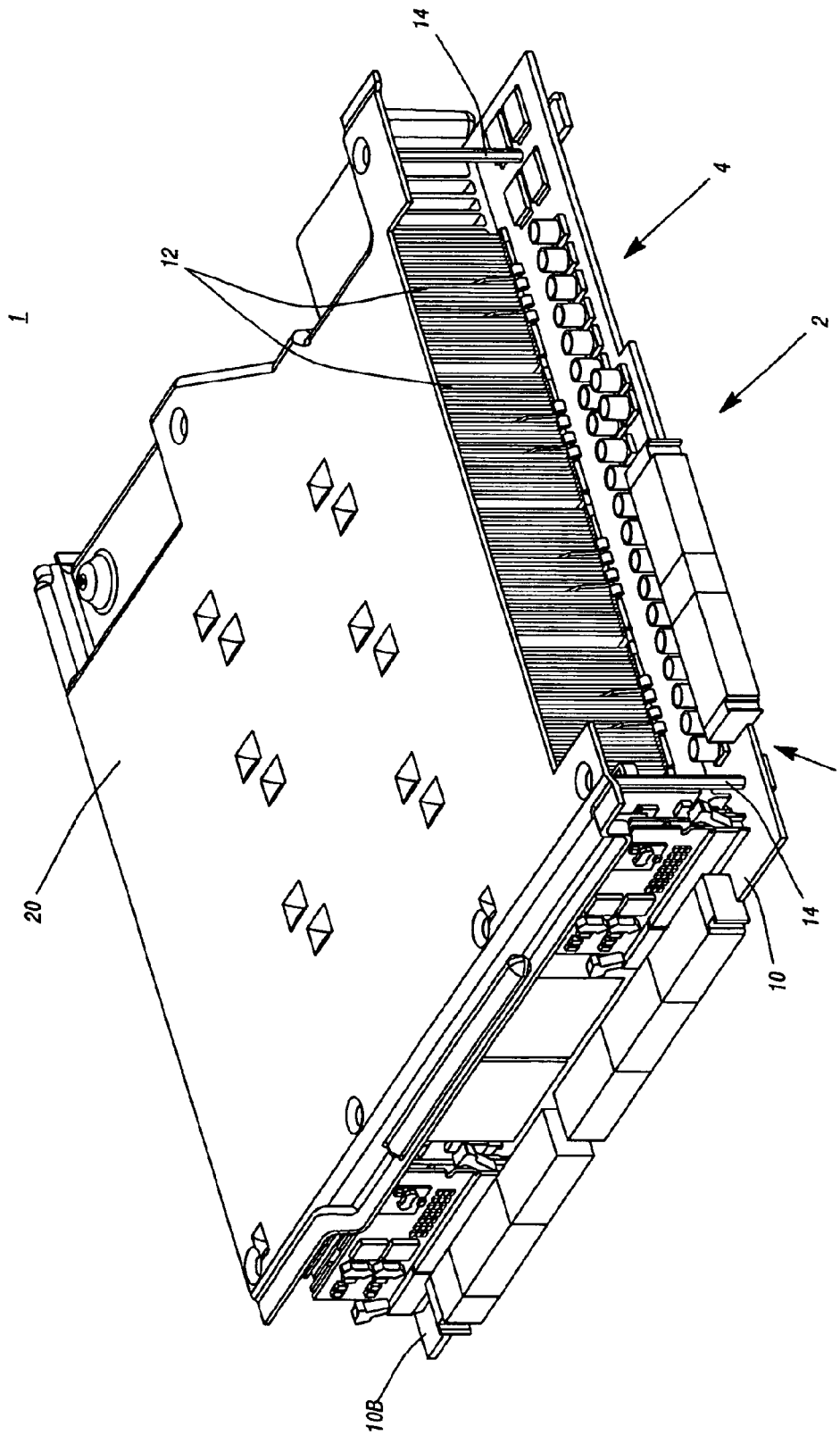
FIG. 1 is a rear perspective view of an exemplary circuit board assembly with an embodiment of an apparatus for directing a flow of air adjacent a circuit board and providing EMI shielding according to the present invention.

Referring now to the drawing, in which like reference numbers refer to like elements throughout, FIG. 1 shows an exemplary circuit board assembly 1 comprising a circuit board 10 populated with various components to form a processor for a computer server. Various components on circuit board 10, such as processor chips (not shown), generate substantial heat, which can adversely effect their performance and life. Therefore, these heat-generating components have heat sinks 12 attached to them to provide heat dissipation. This heat dissipation is greatly enhanced by introducing airflow 2 adjacent circuit board 10. An apparatus 20 is disposed over circuit board 10 in a fixed relationship to direct airflow 2 proximate circuit board 10 providing air-cooling to one or more heat-generating components on circuit board 10.

As shown in FIG. 1, apparatus 20 is formed to maximize airflow through fins of heat sinks 12 for optimum cooling of the heat-generating components attached to heat sinks 12. Apparatus 20 is formed such that, when it is affixed to circuit board 10, it forms a flow channel 4 between apparatus 20 and circuit board 10. Airflow 2 is created by one or more fans (not shown) proximate a back edge 10A of circuit board 10 and directed toward a front edge 10B of circuit board 10.

As shown in the exemplary circuit board assembly of FIG. 1, apparatus 20 is affixed to circuit board 10 by standoffs 14, forming flow channel 4 between apparatus 20 and circuit board 10. Standoffs 20 are elongated structural columns having first and second ends, and may have a cross-section that is generally hexagonal. Standoffs 14 are affixed to circuit board 10 at their first ends by threaded engagement or by other fastening means, known in the art. At their second ends, standoffs 14 are configured to provide a releasable engagement, such as snap-on engagement with apparatus 20, as will be described hereafter.

Airflow 2 is provided by fans (not shown) mounted on the back of a housing in which circuit board assembly 1 is located. Flow channel 4 is formed by apparatus 20 between apparatus 20 and circuit board 10, directing airflow 2 adjacent circuit board 10 and between fins of heat sinks 12. Apparatus 20 comprises a barrier 22 (FIG. 2) configured to optimize airflow 2 to enhance cooling of the heat-generating components on circuit board 10.

Figure 2:
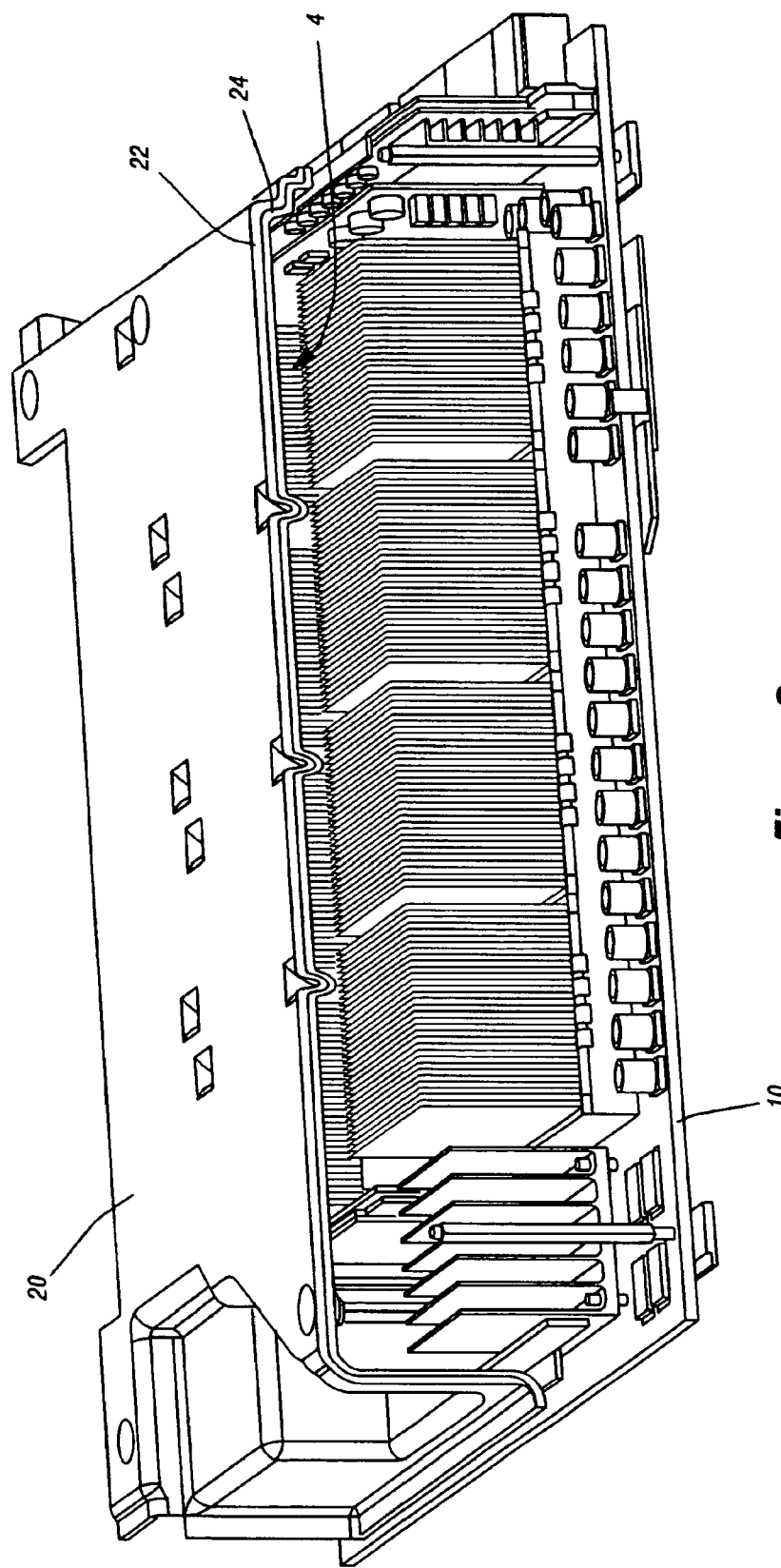
FIG. 2 is a front perspective view, partially in section, of the circuit board assembly of FIG. 1.

More specifically, and as shown in FIG. 2, apparatus 20 is contoured to enclose the sides of air channel 4. As shown in FIG. 2, apparatus 20 includes a vertical wall on the left side of circuit board 10. On the right side of circuit board 10 apparatus 20 mates with a vertically oriented circuit card mounted on circuit board 10 to contain airflow 2 proximate circuit board 10. The vertical wall of apparatus 20 is contoured to direct airflow 2 such that the rate of airflow is maximized though the fins of heat sinks 12. As shown, the fins of heat sinks 12 as well as circuit board 10 and various circuit cards mounted on circuit board 10 age configured to extend is parallel to airflow 2 to maximize the cooling effect of airflow 2 to optimize cooling.

As shown in the exemplary embodiment of FIGS. 2 through 6, apparatus 20 comprises a barrier 22 and a conductive layer 24. Barrier 22 is a structural component configured to extend over circuit board 10 and abut circuit board 10 and/or components or circuit cards mounted on circuit board 10 to form flow channel 4 closed at the sides of circuit board 10. Airflow 2 is directed through flow channel 4 enhancing heat dissipation from heat-generating components mounted on circuit board 10.

Barrier 22 may be formed from an engineered plastic, such as a vacuum molded ABS plastic or other suitable plastic material, though other materials are contemplated as well. Barrier 22 may optionally have flame retardant and antistatic treatments. Forming barrier 22 of an engineered plastic allows it to be vacuum molded into a complex geometry to direct airflow and optimize cooling. Plastics, however, are typically non-conductive and do not provide EMI shielding.

A conductive layer 24. Is physically associated with barrier 22, as shown in FIGS. 2 through 6 to provide shielding to reduce EMI formed by components and connections on circuit board 10. In the exemplary embodiment illustrated in FIGS. 2–6, conductive layer 24 comprises a conductive spray coating, such as metal-loaded paints, available, for example, from Applied Coating Technologies in Tipton, United Kingdom. Silver, silver-plated copper, or copper loaded paints may be used for this conductive spray coating, providing a continuous conductive layer 24. The paint used to forum the conductive layer 24, if a paint is used, may contain one or more, solvents to improve adhesion to the substrate. For example, conductive layer 24 may comprise a paint formulated using mild solvents, which can be mechanically removed to allow the plastic barrier 22 to be re-cycled. Water-based paints, which allow the coating to be chemically removed when recycling, may also be used for conductive spray coating of barrier 22.

The shielding material can be sprayed on to plastic barrier 22 using an air atomizer or airless spray equipment. The spray pattern, paint thickness, and conductive pigment can be tailored for each application to provide optimal shielding performance and cost. This spray application allows a continuous conductive layer 24 to be applied to a barrier 22 having a complex geometry, which is desired to optimize airflow. The surface resistivity will vary depending on the conductive paint used, but is typically in the range of between about 105 e/sq and 0.01 e/sq. The paint thickness may vary from 0.001 inches to 0.01 inches or more, depending on the composition of the paint and the level of shielding to be provided.

This conductive spray coating adheres to barrier 22 to form one or more continuous conductive layers 24. A surface preparation, such as is known in the art, may be used to enhance the adherence of the conductive paint to a barrier 22. Conductive layer 24 may be applied to the bottom surface of barrier 22, as shown, or optionally, to the top surface of barrier 22 or to both top and bottom surfaces of barrier 22.

Conductive layer 24 is electrically grounded to provide shielding for circuit board 10 to reduce EMI. Conductive layer 24 may be grounded, for example, through electrical contact with a ground plane in circuit board 10 (e.g., through a mechanical fastener such as standoff 14) or through electrical contact with the frame or chassis in which circuit board 10 is mounted (e.g., through a clip).

In an alternative exemplary embodiment, conductive layer 24 may comprise a conductive material, such as a copper, nickel, or another conductive metal or metal alloy. This conductive material may be physically associated with barrier 22 by electroless plating the conductive material onto a surface of barrier 22. One method for electroplating a barrier 22 comprising an engineered plastic is an overall electroless plating. In which barrier 22 is introduced into a series of plating baths, such that the electroless plating adheres to all of the surfaces of barrier 22. Overall electroless plating may be performed using automated plating equipment to provide low cost shielding. The overall plating process may directly plate a plastic barrier 22.

Electroless plating can also be applied selectively to plastic barrier 22, such as just the top surface or just the bottom surface. Selective plating may utilize a special autocatalytic base coat, which is applied to the areas where plating is desired. The chemical make-up of the base coat allows copper or another metal to be drawn out of solution and deposited on to this special base coat uniformly. Optionally, a subsequent step of overplating nickel or another metal is used to provide environmental stability for the highly conductive copper, for example, and enhance scratch and wear resistance. Throughout the plating process the chemistries of the various plating baths may be controlled to reduce aggressive attack of the plastic barrier 2. Though other thicknesses can be selected, the coating may range in thickness from about 0.001 Inches to 0.002 Inches.

Another plating process that may be used to apply a conductive coating to barrier 22 is electrolytic plating. A nickel layer, for example, can be chemically or electrically deposited over a layer of pure copper, for example. For recycling, parts can be dipped in an acid solution to remove the plated layers.

In an alternative exemplary embodiment, conductive layer 24 is physically associated with barrier 22 using vacuum metalization. Vacuum metalization may be performed using the Elamet process (a patented process developed by Degussa in Germany). Such coatings have a smooth metallic appearance and are highly ductile. They adhere to most engineering plastics with UL approval of over 65 substrates available. In one form, the process deposits a pure layer of aluminum (99.8%) and as aluminum dissolves in sodium hydroxide parts are easy to recycle. Using multi-impression, high precision masking tools parts can be coated selectively.

In yet another alternate embodiment of the invention, conductive layer 24 may comprise a conductive film, such as a mylar film or a thin metal sheet. This conductive film may be physically associated with barrier 22 by adhering the conductive film to barrier 22 with an adhesive or by laminating the conductive film to barrier 22.

In still another alternative embodiment of the invention, apparatus 20 may comprise a conductive barrier material, such that it is both the barrier 22 and the conductive layer 24. This conductive barrier may comprise a conductive plastic, such as an ABS plastic loaded with carbon fibers, or the like. Alternatively, the conductive barrier may comprise a formed metal sheet.

Figure 3:
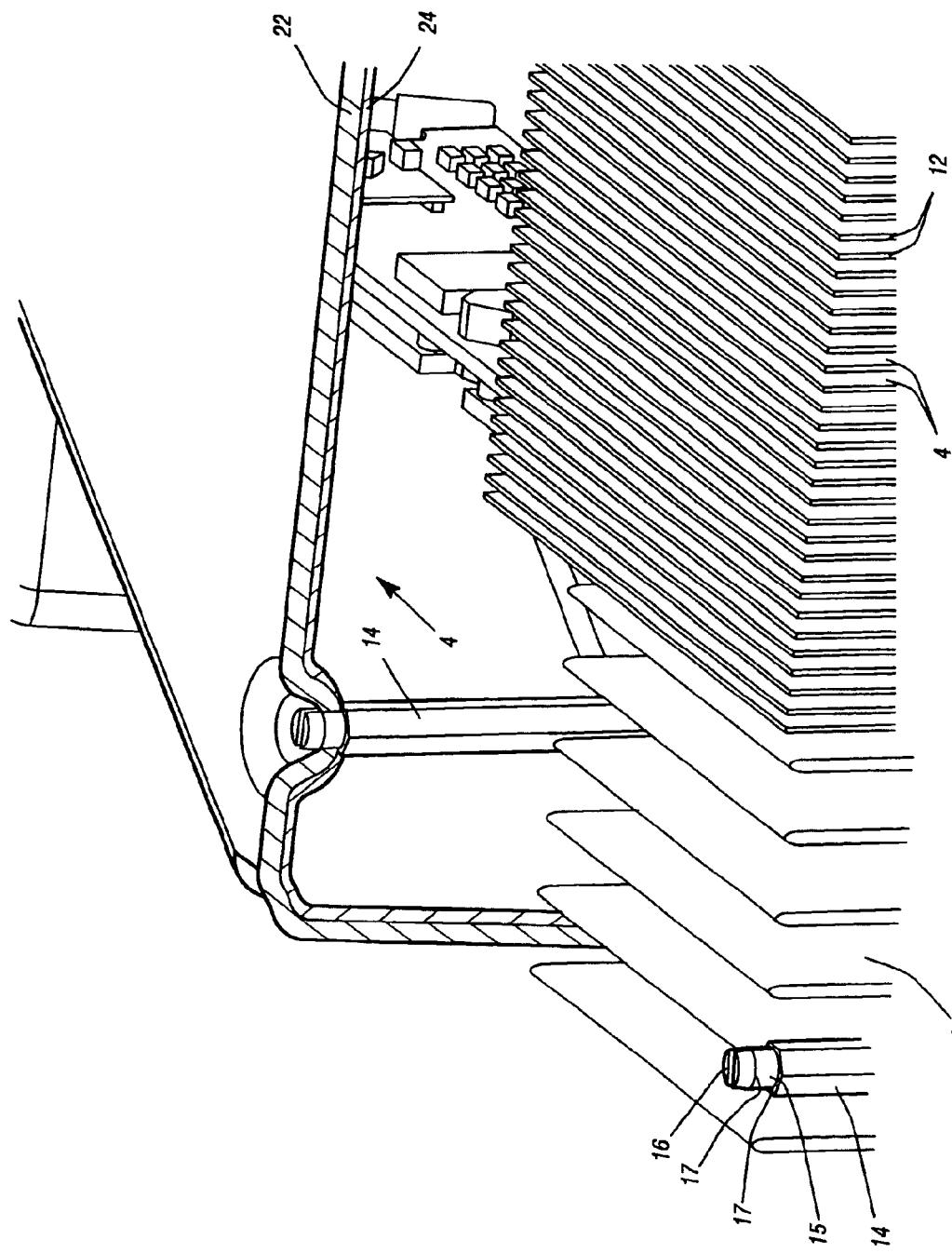
FIG. 3 is a detail view, partially in section, of the circuit board assembly of FIG. 1 showing an embodiment of standoffs for affixing the apparatus of FIG. 1 to a circuit board according to an exemplary embodiment of the invention.
Figure 4:
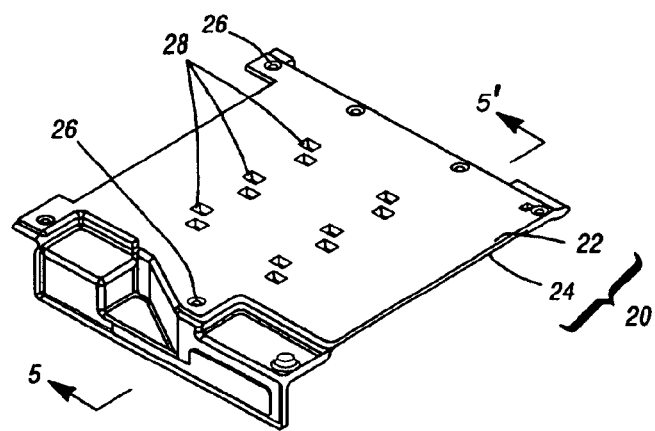
FIG. 4 is a front perspective view of the apparatus of FIG. 1 for directing a flow of air adjacent a circuit board and providing EMI shielding.
Figure 5:
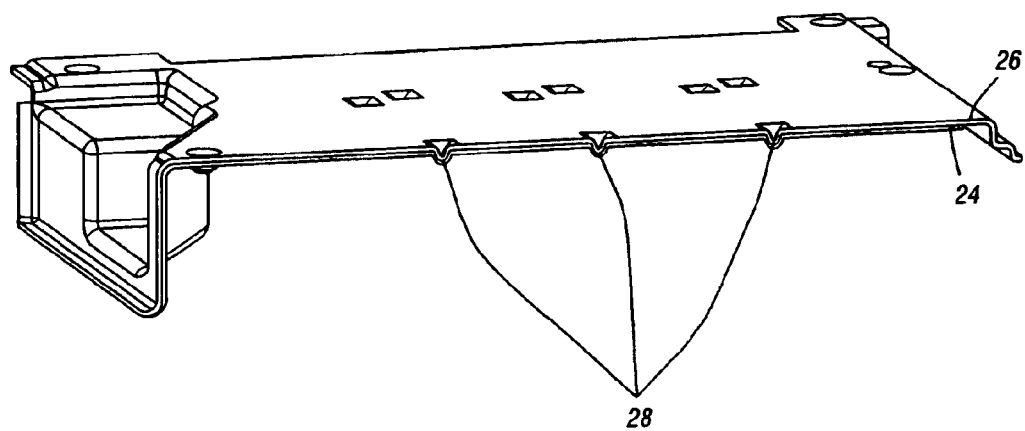
FIG. 5 is a cross-sectional view of the apparatus of FIG. 4 taken generally along axis 5—5' shown in FIG. 4.

As shown in FIGS. 1 and 3, standoffs 14 extend upwardly from the circuit board 10, and apparatus 20 is attached to standoffs 14 by snap-on engagement. Apparatus 20 comprises openings 26 configured to receive standoffs 14. At their top end, standoffs 14 are configured with a split connector 16 comprising two leaf springs capable of pivoting together to fit through openings 26, and tapered to engage openings 26 and provide the necessary pivoting force to pass through openings 26. A recess 15 is disposed between split connector 16 and the main body of each standoff forming shoulders 17 at each end of recess 15 to retain apparatus 20. The shoulder 17 facing conductive layer 24 is configured to provide electrical contact between standoff 14 and conductive layer 24. At circuit board 10, standoffs 14, which comprise conductive material, are grounded by connection to grounding pads on circuit board 10 connected to a ground plane in circuit board 10. Thus, standoffs 14 form electrical contact between conductive layer 24 and a ground plane in circuit board 10 to electrically ground conductive layer 24 of apparatus 20 to provide shielding for circuit board 10 to reduce EMI. Openings 26 may optionally be recessed, as best shown in FIG. 3, by forming an indentation around each of openings 26. These recessed openings allow split connectors 16 to extend through openings 26 without requiring additional clearance, above the barrier.

In an alternative exemplary embodiment, conductive layer 24 of apparatus 20 may be grounded to a chassis or frame (not shown) surrounding circuit card assembly 1 by conductive clips (not shown). These clips may be spring devices comprising a conductive material and affixed at one end to, apparatus 20 (e.g., by a crew engaged in a threaded hole in apparatus 20) in electrical contact with conductive layer 24. At their opposite end, these clips extend outwardly from apparatus 20 (e.g., to form a leaf spring) in yielding contact with the chassis or frame in which circuit board 10 is mounted. Spring force from these clips provides frictional contact with the chassis or frame when the circuit board 10 and apparatus 20 are installed in the chassis or frame. This frictional contact provides a ground path for conductive layer 24 and may help to hold circuit board 10 and apparatus 20 in the chassis or frame. Alternatively, the clips may engage a fasten er, for example, projecting from the chassis or frame. In this configuration, conductive layer 24 is preferably disposed on the top face of barrier 22, but may also be on the bottom surface or may be disposed throughout barrier 22 in the case of a conductive barrier. These conductive clips may be used with or without standoffs 14.

Figure 6:
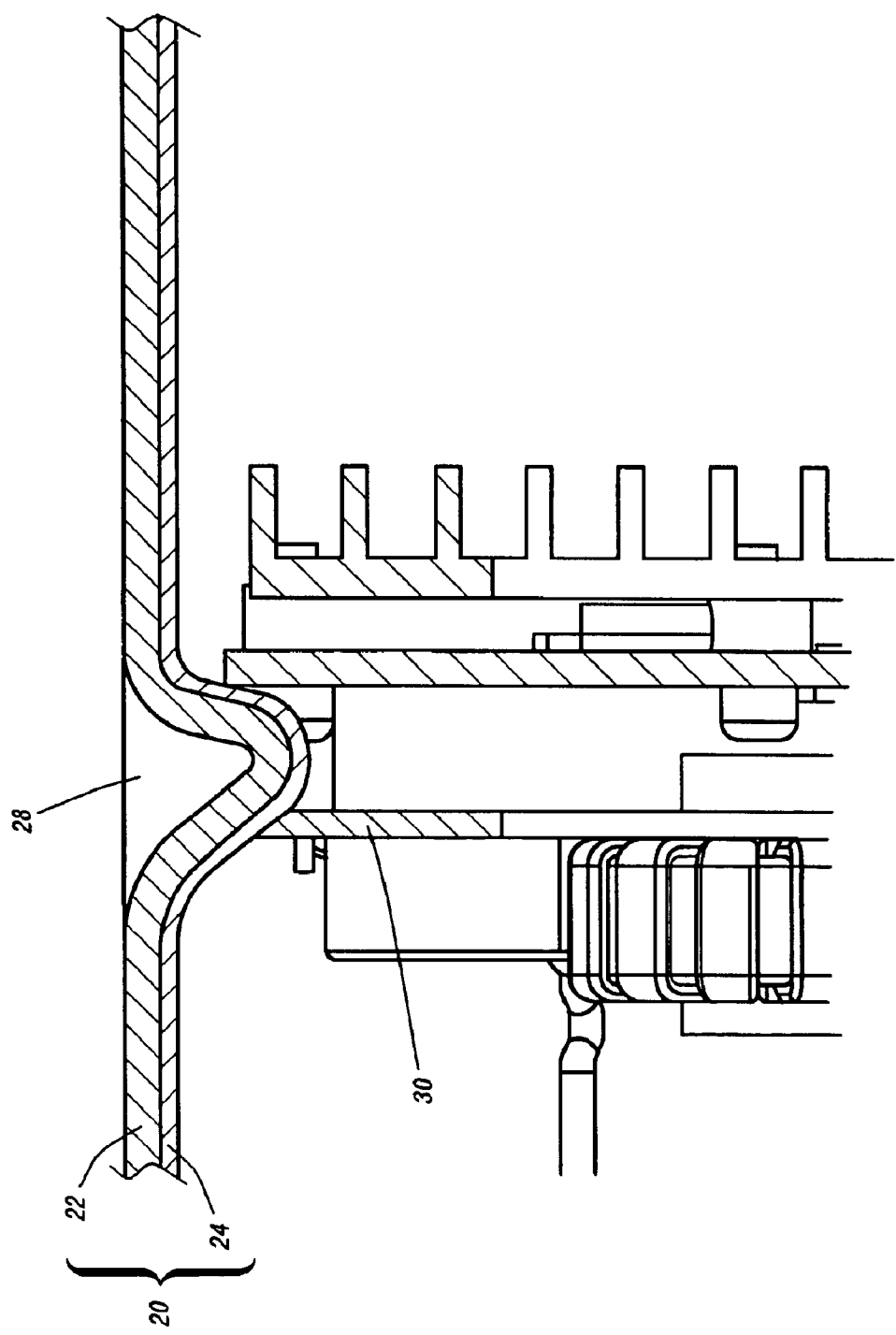
FIG. 6 is a detail view, partially in section, of a retention feature in the apparatus of FIG. 4.

Apparatus 20 may optionally comprise detents or retention features 28, as shown in FIG. 6. Retention features 28 comprise indentations in apparatus 20 extending toward circuit card 10. Retention features 28 are configured and positioned to engage an edge of one or more circuit cards vertically mounted on circuit board 10. Although the invention is illustrated and described herein with reference to specific embodiments, the invention is not intended to be limited to the details shown. Rather, various modifications may be made in the details within the scope and range of equivalents of the claims and without departing from the invention.

While preferred embodiments of the invention have been shown and described herein. It will be understood that such embodiments are provided by way of example only. Numerous variations changes and substitutions will occur to those skilled in the art without departing from the spirit of the invention. Accordingly it is intended that the appended claims cover all such variations as fall within the spirit and scope of the invention.

What is claimed:

1. An apparatus for directing air adjacent a circuit board and for providing shielding to reduce electromagnetic interference, the apparatus comprising:
    a barrier configured to extend proximal the circuit board and to direct a flow of air adjacent the circuit board for cooling said barrier comprising a wall portion configured to abut the circuit board, thereby at least partially forming a flow channel; and
    at least one conductive layer physically associated with said barrier, said conductive layer being electrically grounded to provide shielding of the circuit board to reduce electromagnetic interference.

2. The apparatus of claim 1 further comprising one or more fasteners configured to secure said barrier relative to the circuit board and to electrically ground said conductive layer.

3. The apparatus of claim 2 wherein said one or more fasteners each comprises a standoff having an end portion configured to be mounted to the circuit board in electrical contact with a ground plane in the circuit board and having an opposite end portion configured to be coupled to said barrier in electrical contact with said conductive layer.

4. The apparatus of claim 1 wherein the circuit board is mountable in a frame and said fasteners comprise clips electrically contacting both said conductive layer and the frame.

5. The apparatus of claim 1 wherein said conductive layer comprises a conductive coating disposed on at least one surface portion of said barrier.

6. The apparatus of claim 5 wherein said conductive coating comprises a paint loaded with a conductive material and sprayed onto at least one surface portion of said barrier.

7. The apparatus of claim 1 wherein said conductive layer comprises a conductive film extending along at least a surface portion of said barrier.

8. The apparatus of claim 7 wherein said conductive film is a mylar sheet.

9. The apparatus of claim 1 wherein said conductive layer is provided by forming said barrier at least partially from a conductive material.

10. An apparatus for directing air adjacent a circuit board and for providing shielding to reduce electromagnetic interference, the apparatus comp rising:
    a barrier configured to extend proximal the circuit board and to direct a flow of air adjacent the circuit board for cooling;
    at least one conductive layer physically associated with said barrier, said conductive layer being electrically grounded to provide shielding of the circuit board to reduce electromagnetic interference; and
    one or more detents positioned to support a component or circuit card of said circuit board.

11. The apparatus of claim 10 wherein said one or more detents are indentations formed in said barrier and extending toward the circuit board.

12. The apparatus of claim 1 wherein said barrier is formed from a plastic.

13. The apparatus of claim 12 wherein said barrier is a molded component.

14. The apparatus of claim 13 wherein said conductive layer is formed by molding said barrier from plastic containing conductive material.

15. A circuit board assembly comprising:
    a circuit board with one or more heat-generating components mounted thereon;
    an air baffle extending proximal said circuit board, said air baffle being configured to direct air over said circuit board for cooling, said air baffle comprising a wall portion configured to abut the circuit board, thereby at least partially forming a flow channel;
    a conductive layer physically associated with said air baffle; and
    a plurality of fasteners mounting said air baffle to said circuit board and electrically grounding said conductive layer to provide shielding of said circuit board to reduce electromagnetic interference.

16. The circuit board assembly of claim 15 wherein said circuit board comprises a ground plane and at least one of said fasteners comprises a standoff having an end portion mounted to said circuit board in electrical contact with said ground plane and having an opposite end portion coupled to said air baffle in electrical contact with said conductive layer.

17. The circuit board assembly of claim 15 wherein said conductive layer comprises a conductive coating disposed on at least one surface portion of said air baffle.

18. A circuit board assembly comprising:

a circuit board with one or more heat-generating components mounted thereon:

an air baffle extending proximal said circuit board, said air baffle being configured to direct air over said circuit board for cooling;

a conductive layer physically associated with said air baffle; and a plurality of fasteners mounting said air baffle to said circuit board and electrically grounding said conductive layer to provide shielding of said circuit board to reduce electromagnetic interference, wherein said circuit board comprises one or more circuit cards mounted vertically on said circuit board and said air baffle comprises one or more detents positioned to support said one or more circuit cards on said circuit board.

19. The circuit board assembly of claim 18 wherein said one or more detents are indentations formed in said air baffle extending toward said circuit board.

20. An air baffle for directing air over a circuit board and shielding said circuit board to reduce electromagnetic interference, the air baffle comprising:

a barrier configured to fixedly extend proximal, said circuit board to form an air channel between said barrier and said circuit board;

a continuous conductive layer physically associated with said barrier; and means for electrically grounding said continuous conductive layer.

21. The air baffle of claim 20 wherein said continuous conductive layer comprises a conductive coating.

22. The air baffle of claim 21 wherein said conductive coating is a spray-applied coating.

23. A method for cooling a circuit board and shielding the circuit board to reduce EMI, the method comprising the steps of:

extending a conductive air baffle proximal the circuit board, thereby defining an air channel between the air baffle and the circuit board for cooling the circuit board;

positioning a wall portion of the air baffle adjacent the circuit board, thereby at least partially forming a flow channel; and electrically grounding the air baffle, thereby shielding the circuit board to reduce EMI.

24. A method for forming an apparatus for directing air adjacent a circuit board and for providing shielding to reduce EMI, the method comprising the steps of:

physically associating at least one conductive layer with a barrier configured to extend proximal the circuit board and to direct airflow adjacent the circuit board for cooling the circuit board;

configuring a wall portion of the barrier to abut the circuit board, thereby at least partially forming a flow channel; and configuring the conductive layer for electrical grounding to provide shielding of the circuit board to reduce EMI.

25. A circuit board assembly comprising:

a circuit board with one or more heat-generating components mounted thereon;

a conductive air baffle extending proximal said circuit board, said air baffle being configured to direct air over said circuit board for cooling, said air baffle comprising a wall portion configured to abut the circuit board, thereby at least partially forming a flow channel; and a plurality of fasteners mounting said air baffle to said circuit board and electrically grounding said air baffle to provide shielding of said circuit board to reduce electromagnetic interference.

* * * * *